(12) United States Patent
Hsieh

(10) Patent No.: US 7,951,662 B2
(45) Date of Patent: May 31, 2011

(54) METHOD OF FABRICATING STRAINED SILICON TRANSISTOR

(75) Inventor: Chao-Ching Hsieh, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 73 days.

(21) Appl. No.: 12/176,409

(22) Filed: Jul. 20, 2008

(65) Prior Publication Data

US 2010/0015771 A1  Jan. 21, 2010

(51) Int. Cl.
*H01L 21/8238* (2006.01)
(52) U.S. Cl. ........ 438/199; 438/197; 438/201; 438/275; 257/E21.616
(58) Field of Classification Search .................. 438/424, 438/197–201, 275; 257/E21.616
See application file for complete search history.

(56) References Cited

U.S. PATENT DOCUMENTS

| | | | |
|---|---|---|---|
| 2005/0285187 A1* | 12/2005 | Bryant et al. | 257/335 |
| 2007/0190741 A1 | 8/2007 | Lindsay | |
| 2008/0081382 A1* | 4/2008 | Yang et al. | 438/14 |

OTHER PUBLICATIONS

A. Wei et al., "Multiple Stress Memorization In Advanced SOI CMOS Technologies", 2007, pp. 216-217, 2007 Symposium on VLSI Technology Digest of Technical Papers.

\* cited by examiner

*Primary Examiner* — Thanh Nguyen
(74) *Attorney, Agent, or Firm* — Winston Hsu; Scott Margo

(57) ABSTRACT

A method of fabricating a strained silicon transistor is provided. Amorphous silicon is formed below the transistor region before the transistor is formed. By using the tensile/compressive strainer, amorphous silicon is recrystallized to form a strained silicon layer. In addition, the dopants in the well can be driven in and activated by using the same annealing process with the amorphous silicon recrystallization.

17 Claims, 14 Drawing Sheets

METHOD OF FABRICATING STRAINED SILICON TRANSISTOR

BACKGROUND OF THE INVENTION

1. Field of the Invention

The present invention relates to a semiconductor device. In particular, the present invention relates to a method of fabricating a strained silicon transistor.

2. Description of the Prior Art

With the trend of miniaturization of semiconductor device dimensions, the scale of the gate, source and drain of a transistor decreases in accordance with the decrease in critical dimension (CD). Due to the physical limitation of the materials used, the decrease in scale of the gate, source and drain results in the decrease of carriers that determine the magnitude of the current in the transistor element, and this can therefore adversely affect the performance of the transistor. Increasing carrier mobility in order to boost up a MOS transistor is an important topic in the field of current semiconductor technique.

In various current techniques, mechanical stress is generated on purpose in the channel to increase the carrier mobility. For example, a silicon germanium (SiGe) channel layer is epitaxically formed on the Si substrate to construct a compressive strained channel to substantially increase the hole mobility. Or, a silicon channel is epitaxically formed on the germanium (SiGe) layer to construct a tensile strained channel to substantially increase the electron mobility.

The selective epitaxial growth may be used to embed doped Ge in the source region and in the drain region after the gate is formed to construct a pressed strained silicon structure for increasing the electron mobility in PMOS. Or, the selective Si epitaxial growth may be used to embed doped C in the source region and in the drain region to construct a tensile strained silicon structure for increasing the electron mobility.

Alternatively, a stress may be applied on the contact etch stop layer (CESL) to generate tensile or compressive strain in the channel of each transistor on the semiconductor substrate to improve the carrier mobility.

With the trend of miniaturization of the dimension of MOS transistors, however, the speed demands on MOS transistors are also growing, so the compressive strain or tensile strain caused by the above-mentioned conventional techniques gradually fail to meet the challenging demand.

SUMMARY OF THE INVENTION

In light of the above, a method of fabricating strained silicon transistors is proposed to solve the problems encountered in the above-mentioned conventional techniques and for further enhancing the operational performance of the MOS transistors.

The present invention first provides a method of fabricating strained silicon transistor. A substrate including a first transistor region, a second transistor region and an insulator disposed between the first transistor region and the second transistor region is provided. Secondly, a first strained silicon layer is formed in the substrate within the first transistor region. Then, a second strained silicon layer is formed in the substrate within the second transistor region. Later, a transistor of a first conductivity type is formed in the first strained silicon layer. Afterwards, a transistor of a second conductivity type is formed in the second strained silicon layer.

The present invention provides another method of fabricating a strained silicon transistor. First, a substrate including a transistor region and an insulator surrounding the transistor region is provided. Secondly, a strained silicon layer is formed in the substrate within the transistor region. Then, a transistor of a first conductivity type is formed in the strained silicon layer.

The present invention provides another method of fabricating a strained silicon transistor. First, a substrate including a transistor region and an insulator surrounding the transistor region is provided. Secondly, an amorphous silicon procedure is performed within the transistor region. Then, a doped well is formed within the transistor region and a strained layer is formed to cover the transistor region. Later, an annealing procedure is performed to form a strained silicon layer in the substrate within the transistor region and to activate dopants in the doped well. Afterwards, the strained layer is removed and a transistor of a first conductivity type is formed in the transistor region.

The feature of the method of fabricating a strained silicon transistor of the present invention is characterized in the timing of employing the stress memory technique (SMT) to form the strained silicon in the transistor region after the isolation structure (a shallow trench isolation structure, for example) is formed but before the transistor is constructed. In addition, by using the method of the present invention, the same mask may be employed to perform a doped well ion implantation procedure and an amorphous silicon procedure. Further, in the method of fabricating the strained silicon transistor of the present invention, the dopant can be driven into the doped wells and activated and simultaneously the strained silicon layer can be formed in the substrate in one single annealing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
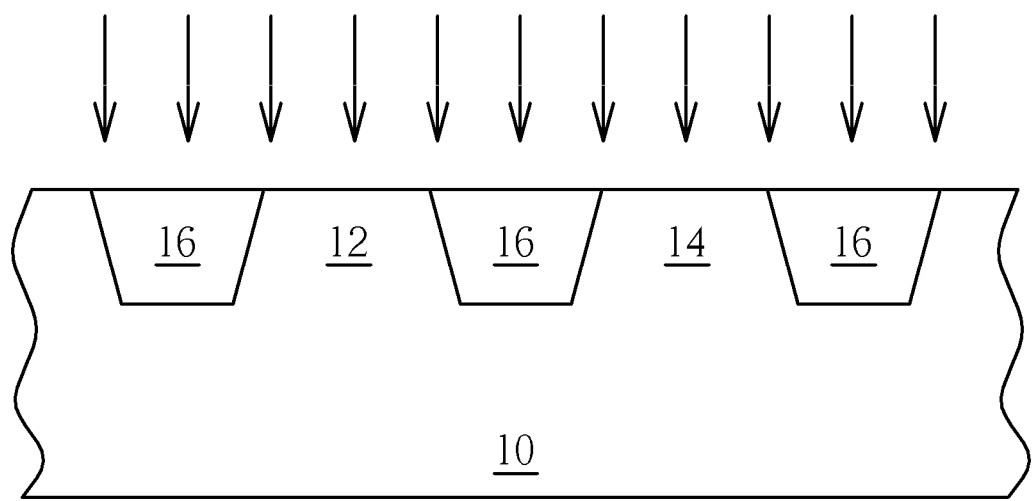
FIGS. 1-5 illustrate a preferred embodiment of the method of fabricating the strained silicon transistor of the present invention.

Please refer to FIGS. 1-5, illustrating a preferred embodiment of the method of fabricating the strained silicon transistor of the present invention. As shown in FIG. 1, a substrate 10 is first provided. The substrate 10 may be Si or SOI. A first transistor region 12 and a second transistor region 14 are defined on the surface of the substrate 10. Secondly, an insulator procedure such as a shallow trench isolation (STI) procedure is performed. For example, a trench is first formed by etching in the substrate 10, then a layer of oxide is deposited by chemical vapor deposition (CVD) to fill the trench and cover the surface of the substrate 10. Later, the oxide layer is planarized by the CMP to form the insulators such as a shallow trench isolation structure 16 in the substrate 10 to segregate the first transistor region 12 and the second transistor region 14, in which the first transistor region 12 is used to form the active area of a transistor of a first conductivity type. In other words, the transistor in the first transistor region 12 is of a first conductivity type, such as an N-type MOS. The second transistor region 14 is used to form the active area of a transistor of a second conductivity type. In other words, the transistor in the second transistor region 14 is of a second conductivity type, such as a P-type MOS. The following example is illustrated by referring to the first transistor region 12 being an N-type MOS and the second transistor region 14 being the P-type MOS.

An amorphous silicon procedure then follows. For example, a blanket ion implantation procedure is used to entirely implant the first transistor region 12 and the second transistor region 14 by using ions such as Xe, Ar and Ge ions. When performing the ion implantation procedure, the concentration of the Xe ions, Ar ions or Ge ions may be greater than 1E14 with an energy of greater than 10 keV.

Figure 2:
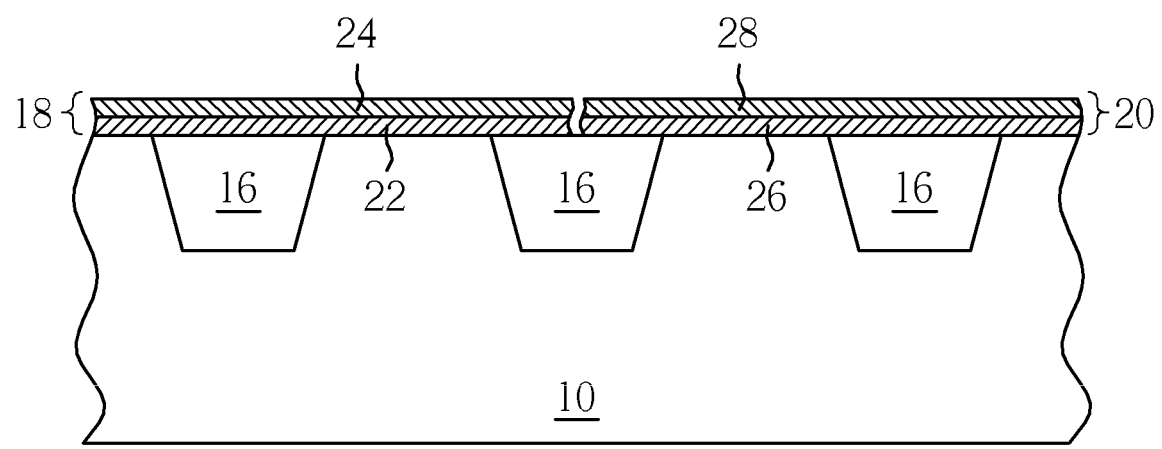

Secondly, as shown in FIG. 2, a first strained layer 18 and a second strained layer 20 are respectively formed on the first transistor region 12 and the second transistor region 14 of the substrate 10. The first strained layer 18 includes a first silicon oxide layer 22 and a first silicon nitride layer 24. The first silicon nitride layer 24 has a tensile strain and disposed on the first silicon oxide layer 22. The purpose of the first silicon oxide layer 22 is to serve as an etching stop layer or a buffer layer to avoid the first silicon nitride layer 24 undertaking too much stress and causing the substrate 10 to be damaged. According to different specifications of the products, the first silicon oxide layer 22 may be optional. In other words, the first strained layer 18 may include merely the first silicon nitride layer 24. Similarly, the second strained layer 20 includes a fourth silicon oxide layer 26 and a second silicon nitride layer 28. The second silicon nitride layer 28 has a compressive strain. The purpose of the fourth silicon oxide layer 26 is also to avoid the second silicon nitride layer 28 undertaking too much stress and causing the substrate 10 to be damaged, or to serve as an etching stop layer of the second silicon nitride layer 28. Moreover, as the first silicon oxide layer 22, the fourth silicon oxide layer 26 is optional, too. The method of forming the first silicon nitride layer 24 and the second silicon nitride layer 28 may be, for example, a silicon oxide layer is first formed on the substrate 10, then a first silicon nitride layer 24 with a tensile strain is entirely formed. Then, the first silicon nitride layer 24 on the second transistor region 14 is removed by a lithographic and an etching step. Because part of the silicon oxide layer on the second transistor region 14 is etched using the aforesaid silicon oxide as the etching-stop layer during the removal of first silicon nitride layer 24, an unetched first silicon oxide layer 22 on the first transistor region 12 and an etched second silicon oxide layer on the second transistor region 14 are formed. Later, a third silicon oxide layer serving as another etching-stop layer is entirely formed on the first silicon nitride layer 24 and on the second silicon oxide layer. Then, a second silicon nitride layer 28 with a compressive strain is formed to entirely cover a third silicon oxide layer on the first silicon nitride layer 24 and the second silicon oxide layer. Then, the second silicon nitride layer 28 on the first silicon nitride layer 24 is removed by a lithographic and etching procedure. Because the second silicon oxide layer and the third silicon oxide layer left on the second transistor region 14 are made of the same material, in FIG. 2 both the second silicon oxide layer and the third silicon oxide layer are regarded as a fourth silicon oxide layer 26. To be supplemented, the second silicon nitride layer 28 on the first silicon nitride layer 24 may not be removed. In other words, the third silicon oxide layer in the aforesaid step are not formed, but the second silicon nitride layer 28 is directly formed on the first silicon nitride layer 24 and the second silicon oxide layer. The second silicon nitride layer 28 would simultaneously cover the first silicon nitride layer 24 and the second silicon oxide layer. Furthermore, the thickness of the first silicon nitride layer 24 should be designed so that the total stress of the first transistor region 12 is provided by the first silicon nitride layer 24.

In addition, the first silicon oxide layer 22 and the first silicon nitride layer 24 may be formed in the same chamber; the fourth silicon oxide layer 26 and the second silicon nitride layer 28 may be formed in the same chamber. In other words, switching substrates between different vacuum chambers is therefore minimized. Further, the adjustment of the stress may be modified by optimizing the deposition procedure parameters or the surface treatment such as ion implantation, annealing or UV radiation. The details are known by persons of ordinary skill in the art and will not be discussed here.

Figure 3:
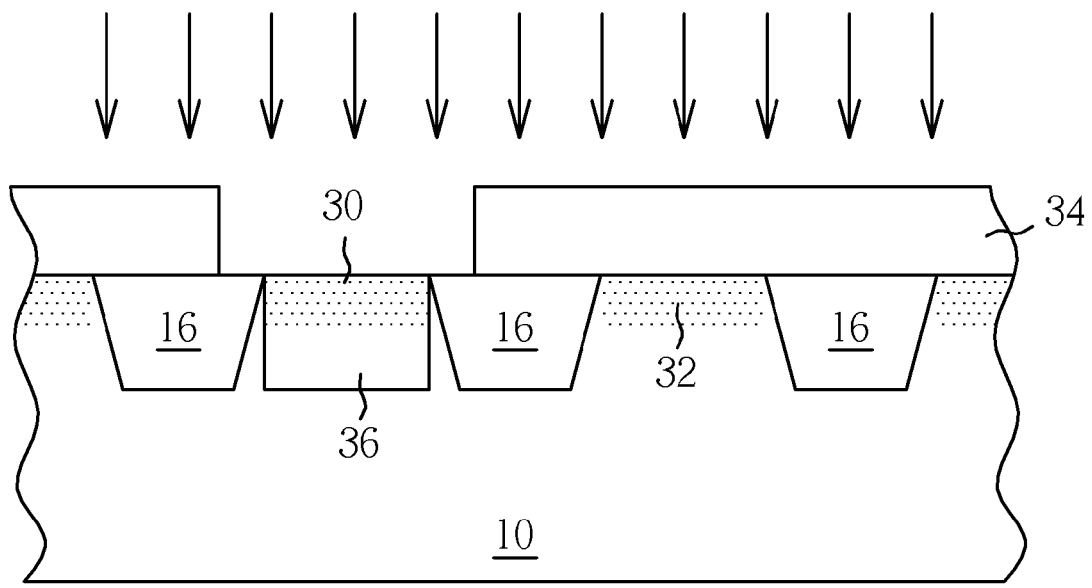

As shown in FIG. 3, an annealing procedure is performed to rearrange the silicon atoms near the surface of the substrate 10 according to the tensile/compressive strain provided by the first strained layer 18 and the second strained layer 20 to respectively form a first strained silicon layer 30 and a second strained silicon layer 32 in the substrate 10 under the first transistor region 12 and the second transistor region 14. Till now, the formation of a first strained silicon layer 30 with a tensile strain and a second strained silicon layer 32 with a compressive strain formed in the substrate 10 has been completed by means of stress memorization technique (SMT). The first strained layer 18 and the second strained layer 20 are removed and a patterned photoresist 34 is then formed to expose the first transistor region 12 and part of the shallow trench isolation (STI) 16. Then a doped well ion implantation procedure is performed to form a P-doped well 36 by P-dopants in the substrate 10 within the first transistor region 12.

Figure 4:
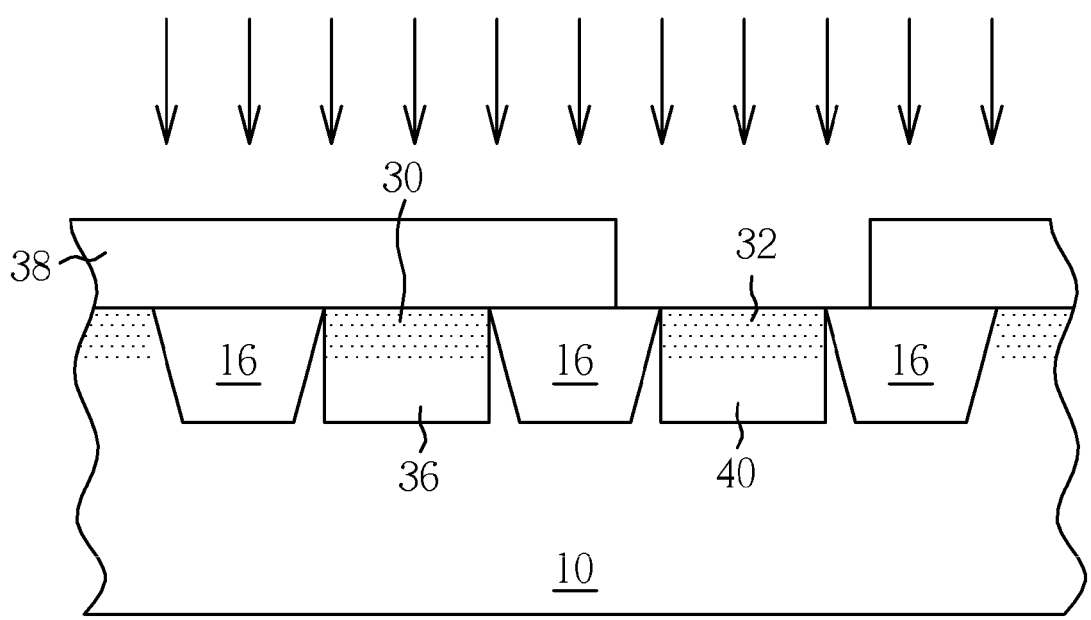

As shown in FIG. 4, after the photoresist 34 is removed, another patterned photoresist 38 is formed to expose the second transistor region 14 and part of the shallow trench isolation (STI) 16. Then a doped well ion implantation procedure is performed to form an N-doped well 40 by N-dopants in the substrate 10 within the second transistor region 14.

Figure 5:
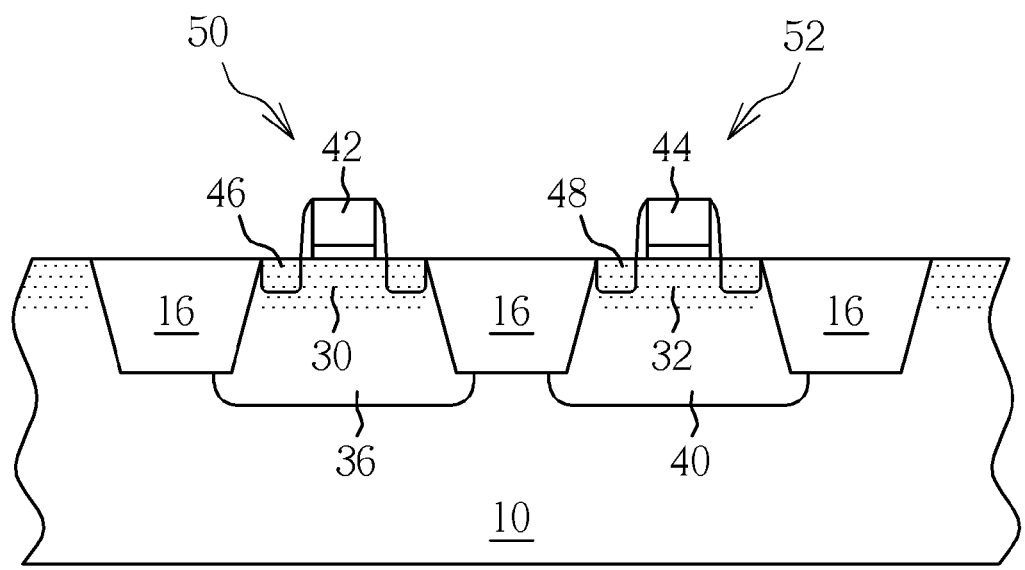

As shown in FIG. 5, a high temperature thermal procedure is performed, such as an annealing procedure, to drive and to activate the dopants in the P-doped 36 well and the N-doped well 40. Afterwards, a gate 42 and a gate 44 and the corresponding N-source/drain doped region 46 and the P-source/drain doped region 48 are respectively formed on the P-doped 36 well and on the N-doped well 40. At this point, the CMOS transistors such as the N-type transistor 46 or the P-type transistor 48 with strained silicon layer are completed.

Please refer to FIGS. 6-9, which illustrate a second preferred embodiment of the process to fabricate the transistor of the present invention. Similar symbols in the second embodiment stand for elements of similar functions in the first embodiment.

Figure 6:
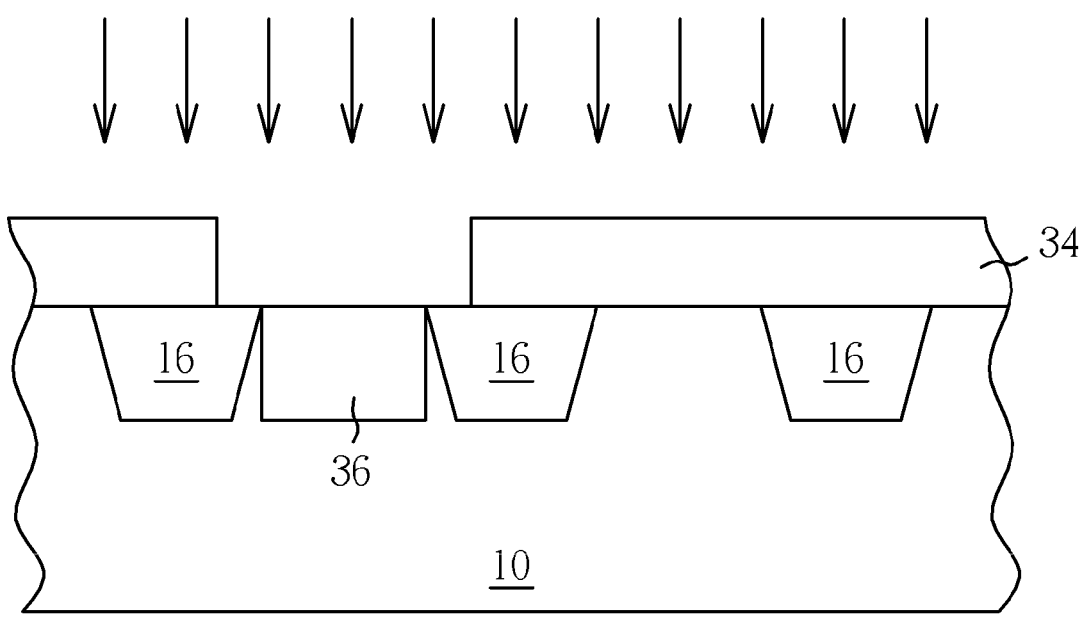
FIGS. 6-9 illustrate a second preferred embodiment of the process of fabricating the transistor of the present invention.

As shown in FIG. 6, first a substrate 10 is provided. There is a first transistor region 12 and a second transistor region 14 on the substrate 10. Secondly, an insulator such as a shallow trench isolation (STI) 16 is formed in the substrate 10 to segregate the first transistor region 12 and the second transistor region 14. The procedures of fabricating the shallow trench isolation (STI) 16 have already been illustrated in the first embodiment and therefore the details are not described here. The first transistor region 12 is used to form the active area of a transistor of a first conductivity type. In other words, the transistor in the first transistor region 12 is of a first conductivity type, such as an N-type MOS. The second transistor region 14 is used to form the active area of a transistor of a second conductivity type. In other words, the transistor in the second transistor region 14 is of a second conductivity type, such as a P-type MOS.

To be continued, a patterned photoresist 34 is formed to expose the first transistor region 12 and part of the shallow trench isolation (STI) 16. Then a first amorphous silicon procedure is performed to ion-implant the first transistor region 12 by an ion-implantation procedure. The ions used in the ion-implantation procedure may be Xe, Ar or Ge ions. The concentration of the Xe ions, Ar ions or Ge ions may be greater than 1E14 with an energy of greater than 10 KeV.

Later, a first doped well ion implantation procedure is performed by using the photoresist 34 as a hard mask to form a P-doped 36 well by P-dopants in the substrate 10 within the first transistor region 12. According to one preferred embodiment of the present invention, the order to perform the first amorphous silicon procedure and the first doped well ion implantation procedure is not limited. For example, the first doped well ion implantation procedure is first performed to form the P-doped well 36, then a first amorphous silicon procedure is performed but the patterned photoresist 34 is simultaneously used as the hard mask.

Figure 7:
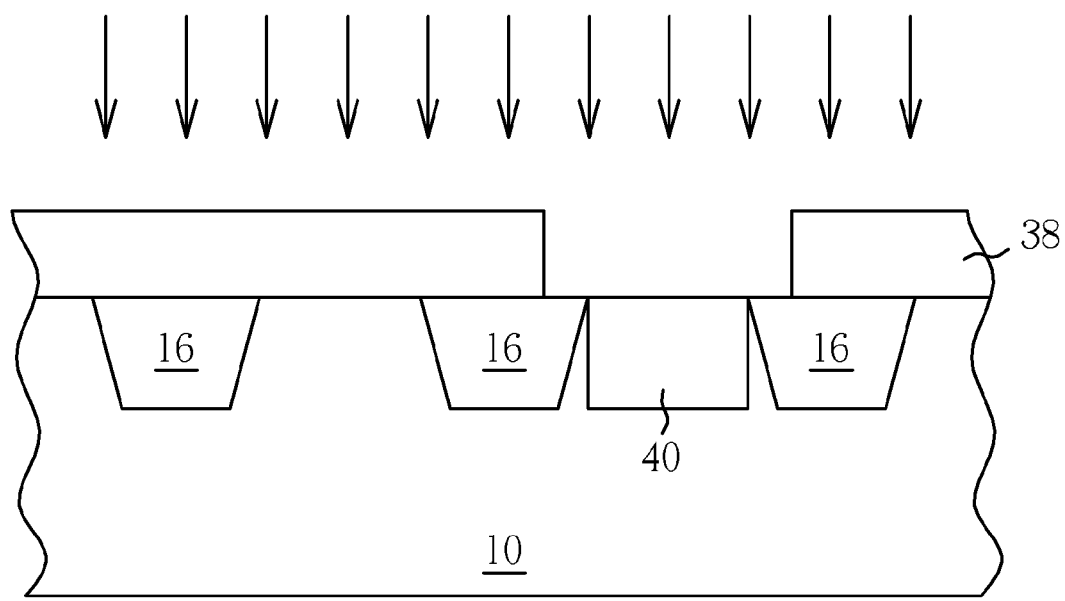

As shown in FIG. 7, the photoresist 34 is removed to form another patterned photoresist 38 to expose the second transistor region 14 and part of the shallow trench isolation (STI) 16. Then a second amorphous silicon procedure is performed to ion-implant the second transistor region 14 by an ion-implantation procedure. Similarly, the ions used in the ion-implantation procedure may be Xe, Ar or Ge ions. The concentration of the Xe ions, Ar ions and Ge ions used in both of the first and the second amorphous silicon procedures may be greater than 1E14 with an energy of greater than 10 KeV. Later, a second doped well ion implantation procedure is performed by using the photoresist 38 as a hard mask to form an N-doped well 40 by N-dopants in the substrate 10 within the second transistor region 14. According to another preferred embodiment of the present invention, similarly, the order to perform the second amorphous silicon procedure and the second doped well ion implantation procedure is not limited, for example the second doped well ion implantation procedure may be performed before the second amorphous silicon procedures, and the patterned photoresist 38 is simultaneously used as the hard mask.

If the steps in the second preferred embodiment of the present invention in FIGS. 6 and 7 are slightly changed, it becomes a third preferred embodiment of the present invention. First, before the patterned photoresist 34 is formed, an amorphous silicon procedure is entirely performed in the first transistor region 12 and in the second transistor region 14. Later, as shown in FIG. 6, the photoresist 34 is formed to perform a doped well ion implantation procedure in the first transistor region 12 to form a P-doped well 36. Afterwards, as shown in FIG. 7, the photoresist 34 is removed to form another patterned photoresist 38. Then a second doped well ion implantation procedure is performed in the second transistor region 14 to form the N-doped well 40. The following steps in the third preferred embodiment are the same as these of the second preferred embodiment.

Figure 8:
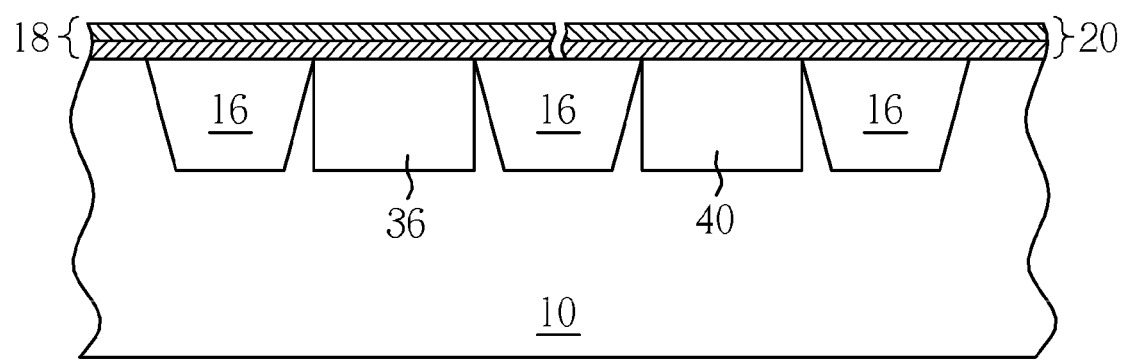

As shown in FIG. 8, a first strained layer 18 and a second strained layer 20 are respectively formed on the substrate 10 within the first transistor region 12 and the second transistor region 14. The first strained layer 18 includes a first silicon oxide layer 22 and a first silicon nitride layer 24. The first silicon nitride layer 24 has a tensile strain and disposed on the first silicon oxide layer 22. According to different specifications of products, the first silicon oxide layer 22 is optional. Similarly, the second strained layer 20 includes a fourth silicon oxide layer 26 and a second silicon nitride layer 28. The second silicon nitride layer 28 has a compressive strain. Like the first silicon oxide layer 22, the fourth silicon oxide layer 26 is also optional. The method of forming the first silicon nitride layer 24 and the second silicon nitride layer 28 has been already described in the first embodiment, and the details will not be discussed here.

Figure 9:
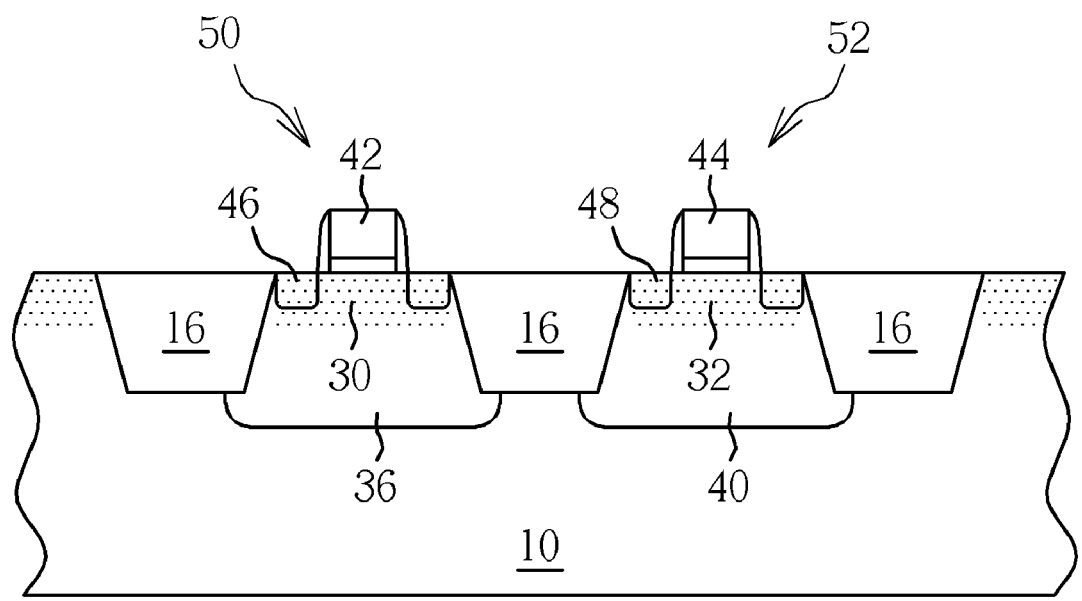

As shown in FIG. 9, a high temperature thermal procedure is performed, such as an annealing procedure, to drive and to activate the dopants in the P-doped 36 well and the N-doped well 40, and to simultaneously and respectively form a first strained silicon layer 30 and a second strained silicon layer 32 in the substrate 10 under the first transistor region 12 and the second transistor region 14. Then, after the first strained layer 18 and a second strained layer 20 are removed, a gate 42 and a gate 44 and the corresponding N-source/drain doped region 46 and the P-source/drain doped region 48 are respectively formed on the P-doped well 36 and on the N-doped well 40. At this point, the CMOS transistors such as the N-type transistor 50 or the P-type transistor 52 with strained silicon layer are completed.

Figure 10A:
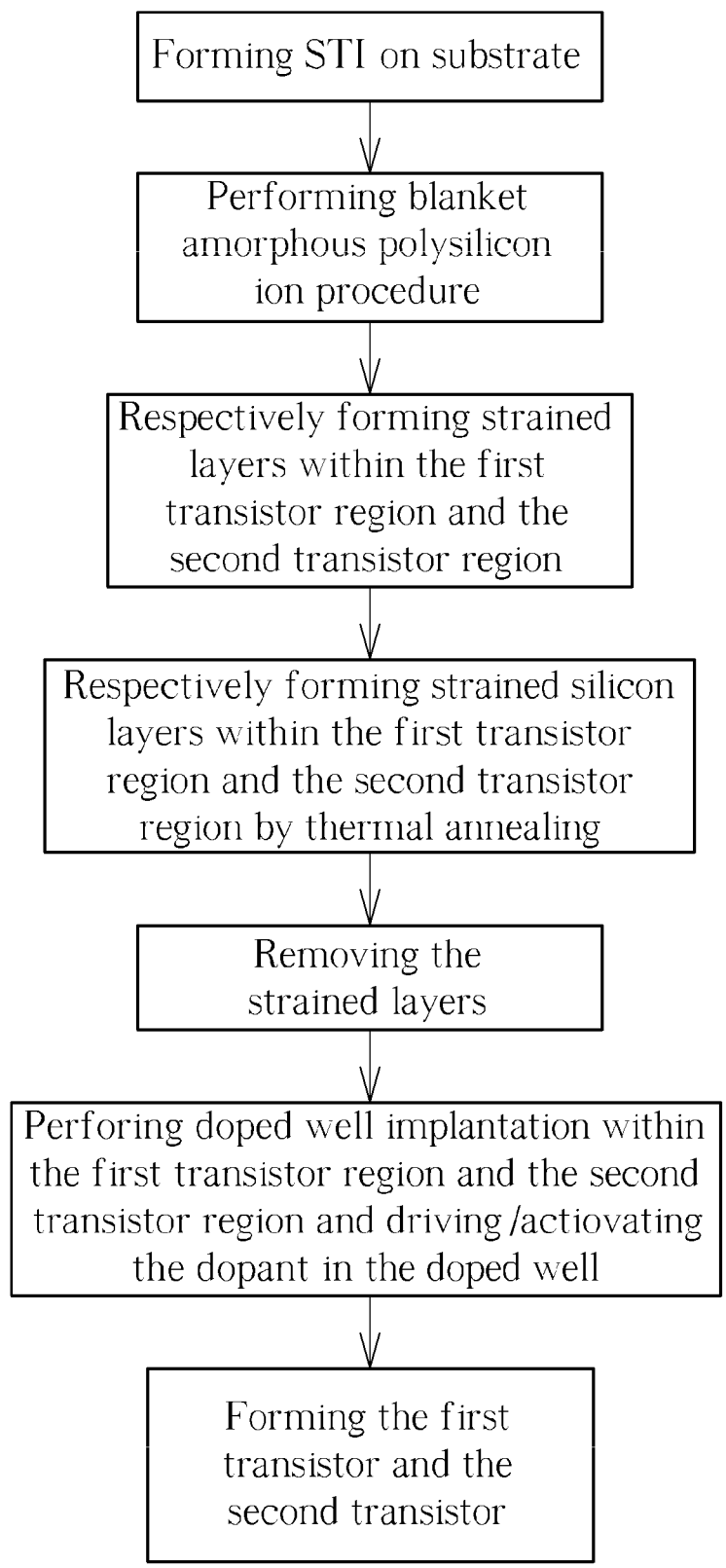
FIG. 10a illustrates procedures of the first preferred embodiment of the present invention.
Figure 10B:
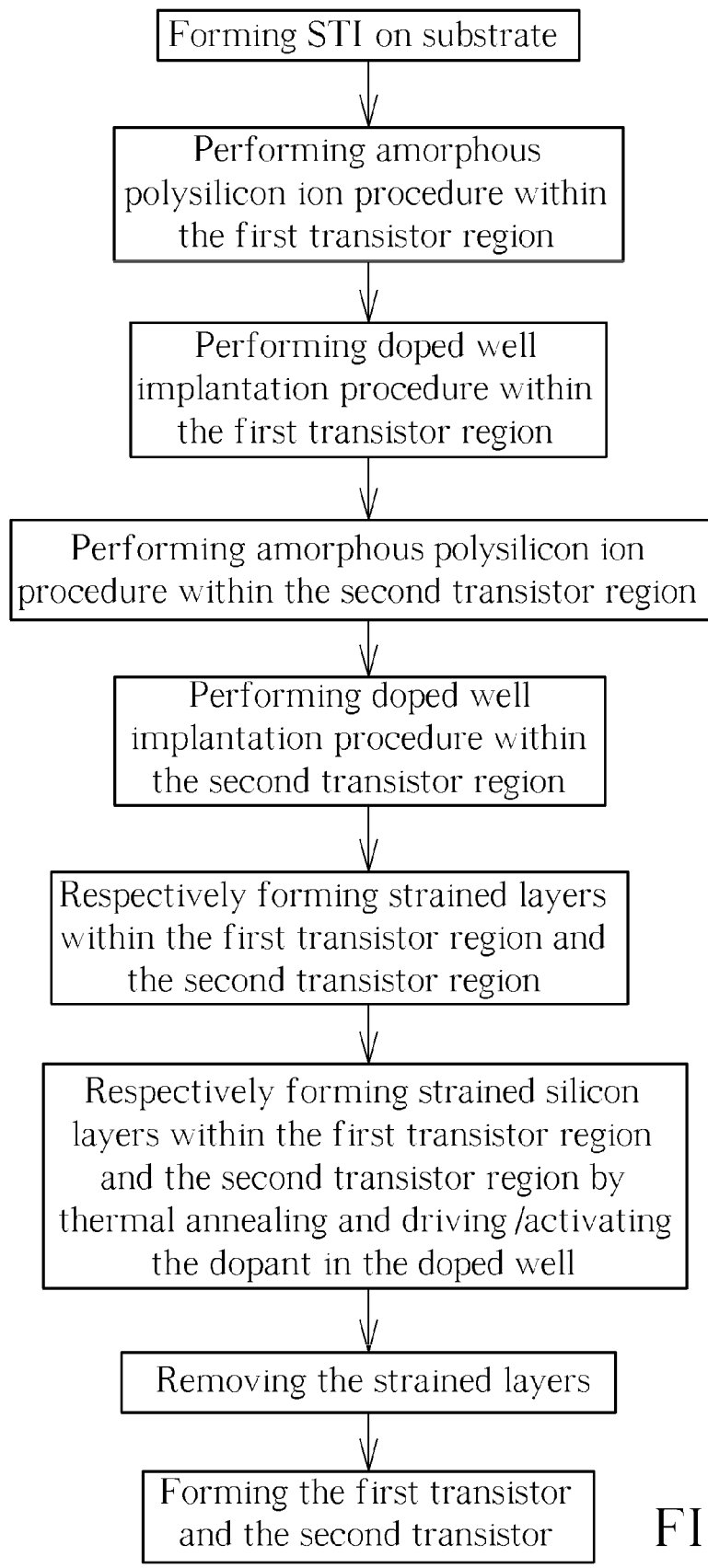
FIG. 10b illustrates procedures of the second preferred embodiment of the present invention and FIG. 10c illustrates procedures of the third preferred embodiment of the present invention.
Figure 10C:
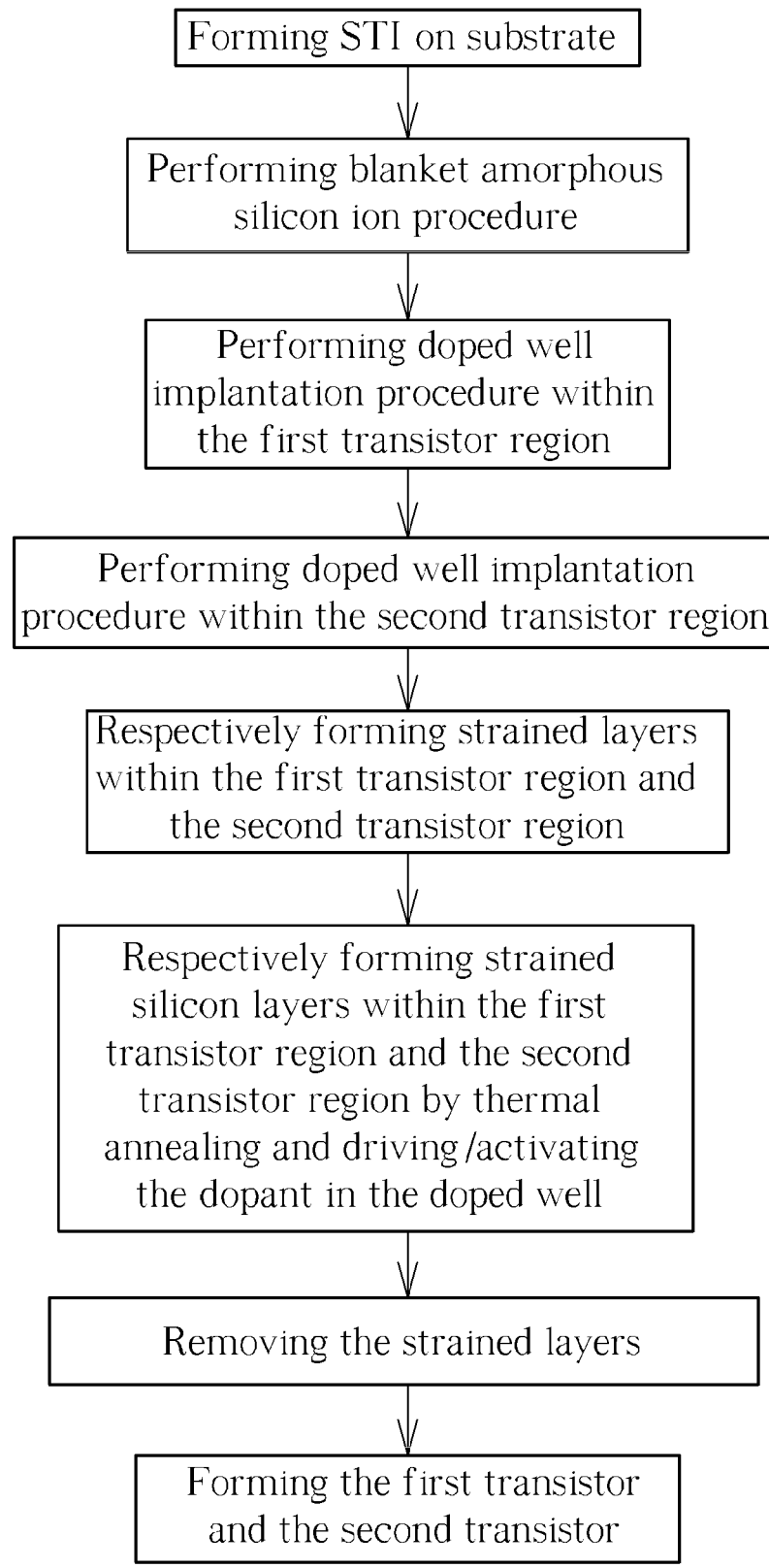

FIG. 10a illustrates the procedures of the first preferred embodiment of the present invention. FIG. 10b illustrates the procedures of the second preferred embodiment of the present invention. FIG. 10c illustrates the procedures of the third preferred embodiment of the present invention.

In view of the above descriptions and what is illustrated in FIGS. 10a, 10b and 10c, the features of the first embodiment, the second and the third embodiment of the present invention lie in that the practice of the amorphous silicon procedure(s) is subsequent to the formation of the shallow trench isolation (STI) but prior to the manufacture of the transistors. In such a way, the strained silicon layer(s) can be entirely formed on the substrate of the transistor regions.

Additionally, the advantages of the second embodiment of the present invention reside in that the same patterned photoresist is used for both the first amorphous silicon procedure and the first high-concentration ion implantation procedure, and another same patterned photoresist is used for both the second amorphous silicon procedure and the second high-concentration ion implantation procedure. Moreover, the same annealing procedure is used for driving and for activating the dopants in the doped well, for the first strained layer and for the second strained layer, and may be performed in the same chamber without switching between different vacuum chambers. Furthermore, as shown in FIG. 10b, if the operational order of the amorphous silicon procedure and the doped well ion implantation procedure is exchanged, this can result in another method for the strained silicon transistor of the present invention.

Figure 11:
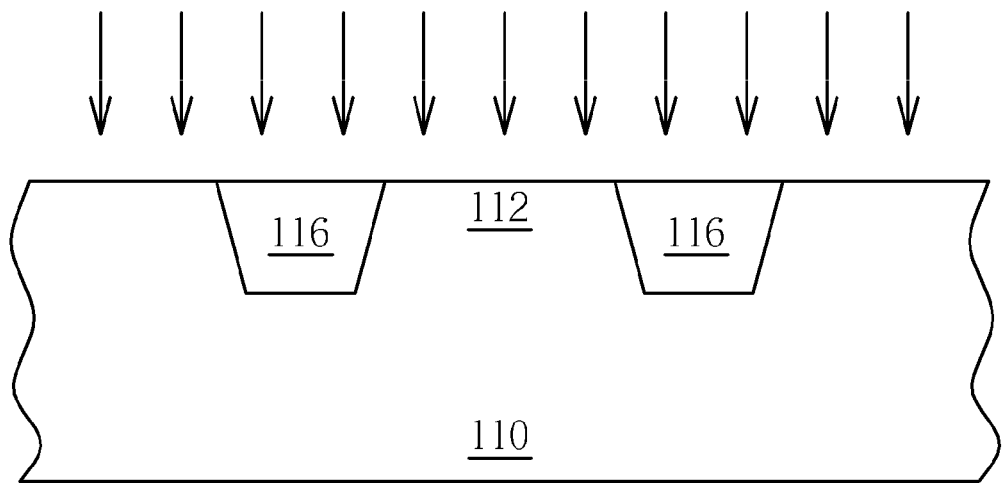
FIGS. 11-13 illustrate a fourth preferred embodiment for fabricating a transistor of the present invention.
Figure 12:
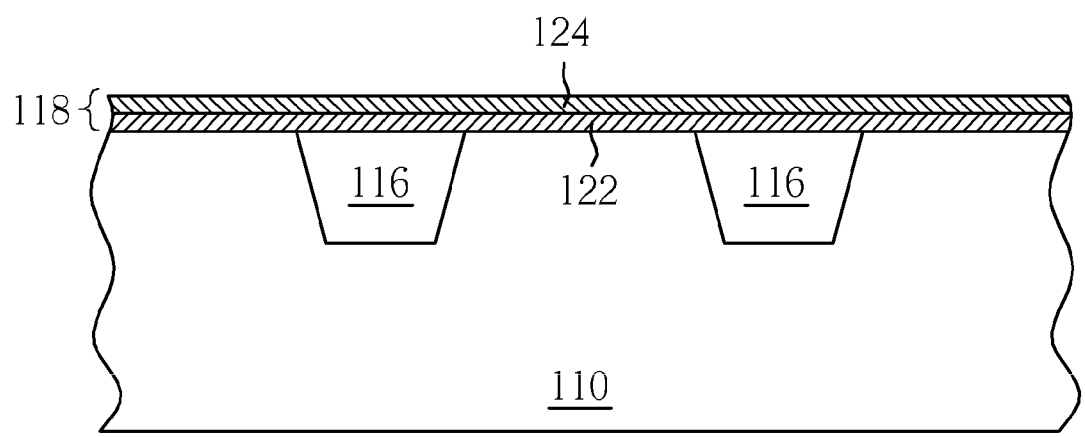
Figure 13:
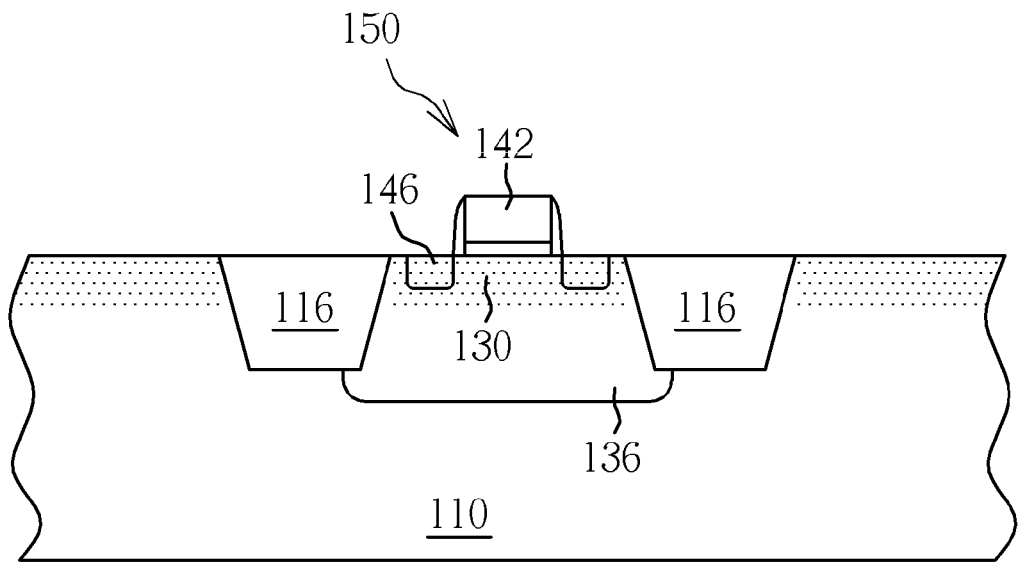

Please refer to FIGS. 11-13, which illustrate a fourth preferred embodiment for fabricating a transistor of the present invention.

As shown in FIG. 11, first a substrate 110 is provided. The substrate 110 includes a transistor region 112. Secondly, an insulator such as a shallow trench isolation (STI) 116 is formed to surround the transistor region 112. The procedures of fabricating the shallow trench isolation (STI) 116 have already been illustrated in the first embodiment and the details are therefore not described here. The transistor region 112 is used to form the active area of a transistor of a specific conductivity type. In other words, the transistor in the transistor region 112 may be of a first conductivity type, such as a P-type MOS or an N-type MOS.

An amorphous silicon procedure then follows. For example, a blanket ion implantation procedure is used to entirely implant the transistor region 112 by using ions such as Xe, Ar and Ge ion. When performing the ion implantation procedure, the concentration of the Xe ions, Ar ions and Ge ions may be greater than 1E14 with an energy of greater than 10 keV.

As shown in FIG. 12, a strained layer 118 is formed on the substrate 110 within the transistor region 112. The strained layer 118 includes a silicon oxide layer 122 and a silicon nitride layer 124. If the first conductivity type is N-type, the silicon nitride layer 124 is adjusted to have tensile strain. If the second conductivity type is P-type, the silicon nitride layer 124 is adjusted to have compressive strain. The adjustment of the stress may be modified by optimizing the deposition procedure parameters or the surface treatment such as ion implantation, annealing or UV radiation. The details are known by persons of ordinary skill in the art and will not be discussed here. According to one preferred embodiment of the present invention, the strained layer 118 may include merely the silicon nitride layer 124 and the silicon oxide layer 122 is optional. In addition, the silicon oxide layer 122 and the silicon nitride layer 124 may be formed in the same chamber.

As shown in FIG. 13, an annealing procedure is performed to rearrange the silicon atoms according to the tensile/compressive strain provided by the strained layer 118 to form a strained silicon layer 130 in the substrate 110 under the transistor region 112. Till now, the formation of a strained silicon layer 130 formed in the substrate 110 has been completed by means of stress memorization technique (SMT). If the first conductivity type is N-type, the strained silicon layer 130 is of tensile strain. If the second conductivity type is P-type, the strained silicon layer 130 is of compressive strain.

Then, a doped well ion implantation procedure is performed to form a doped well 136 by P or N-dopants in the substrate 110 within the transistor region 112. Later, a high temperature thermal procedure is performed, such as an annealing procedure, to drive and to activate the dopants in the doped well 136. Then, a gate 142 and a source/drain doped region 146 are formed on the doped well 136. At this point, the CMOS transistors 150 with strained silicon layer are completed.

Figure 14:
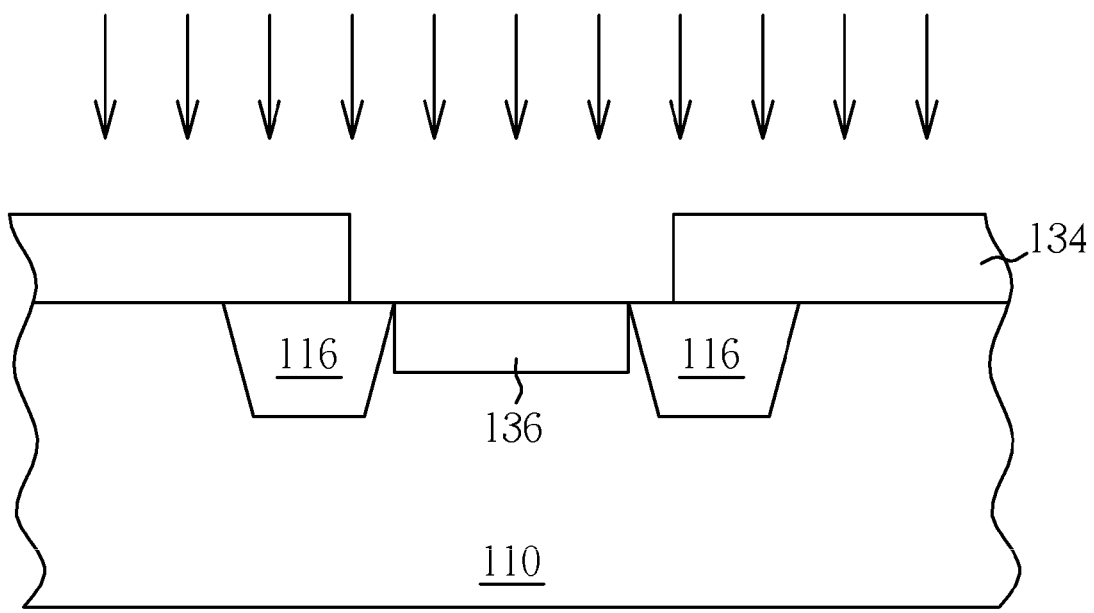
FIGS. 14-16 illustrate a fifth preferred embodiment of the process of fabricating a transistor of the present invention.
Figure 15:
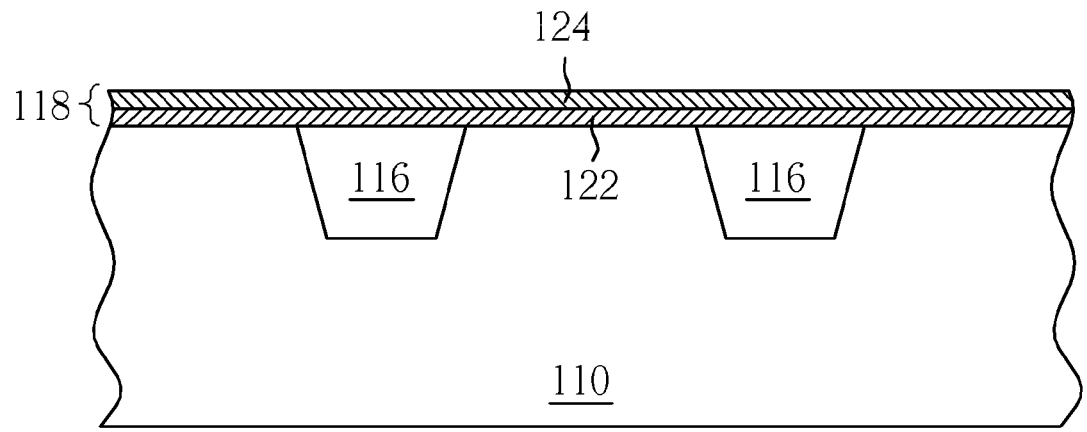
Figure 16:
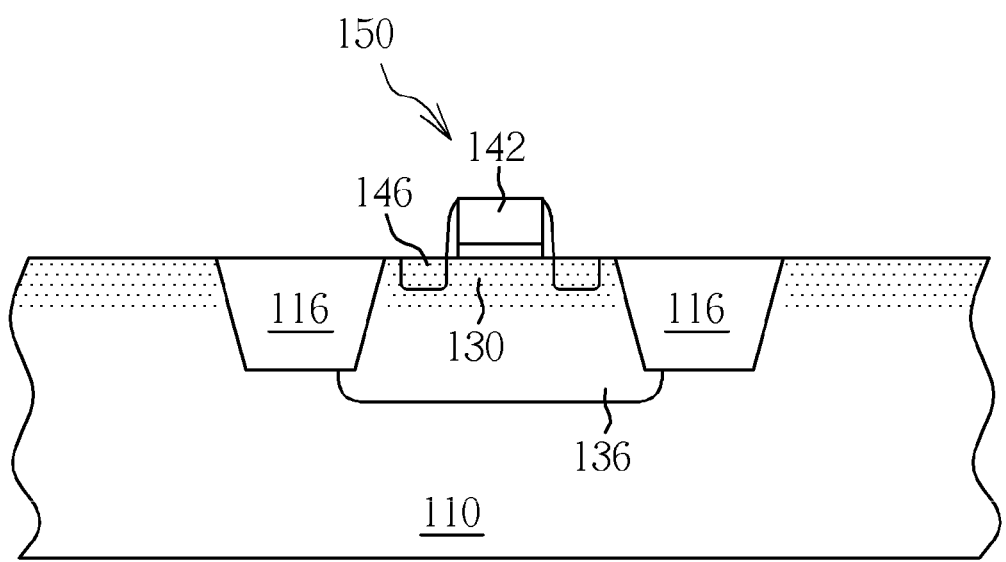

Please refer to FIGS. 14-16, which illustrate a fifth preferred embodiment of the process for fabricating a transistor of the present invention. Similar symbols in the fourth embodiment stand for elements of similar functions in the fourth embodiment.

As shown in FIG. 14, first a substrate 110 is provided. The substrate 110 includes a transistor region 112. Secondly, an insulator such as a shallow trench isolation (STI) 116 is formed to surround the transistor region 112. The transistor region 112 is used to form the active area of a transistor of a specific conductivity type. In other words, the transistor in the transistor region 112 may be of a first conductivity type, such as a P-type MOS or an N-type MOS.

A patterned photoresist 134 is formed. Then a first amorphous silicon procedure is performed in the transistor region 112 to ion-implant the transistor region 112 by an ion-implantation procedure. The ions used in the ion-implantation procedure may be Xe, Ar or Ge ions. The concentration of the Xe ions, Ar ions and Ge ions may be greater than 1E14 with an energy of greater than 10 keV. Later, a doped well ion implantation procedure is performed by using the photoresist 134 as a hard mask to form a doped well 136 by dopants in the substrate 110 within the transistor region 112. Please note that if the transistor of first conductivity type is NMOS, the ions used in the high concentration ion-implantation procedure are P-type. If the transistor of the second conductivity type is PMOS, the ions used in the high concentration ion-implantation procedure are N-type. According to another preferred embodiment of the present invention, the order of performing the amorphous silicon procedure and the high concentration ion implantation procedure is not limited. For example, the doped well ion implantation procedure is first performed to form the doped well 136 then the amorphous silicon procedure is performed, but the patterned photoresist 134 is simultaneously used as the hard mask.

If the steps in the fifth preferred embodiment of the present invention in FIG. 14 are slightly changed, it becomes a sixth preferred embodiment of the present invention. First, before the photoresist 134 is formed, an amorphous silicon procedure is entirely performed in the transistor region 112. Later, the photoresist 134 is formed to perform a doped well ion implantation procedure in the first transistor region 112 to form a doped well 136. The following steps in the sixth preferred embodiment are the same as these of the fifth preferred embodiment.

As shown in FIG. 15, a strained layer 118 is formed on the substrate 110 within the transistor region 112. The strained layer 118 includes a silicon oxide layer 122 and a silicon nitride layer 124. If the first conductivity type is N-type, the silicon nitride layer 124 is adjusted to have tensile strain. If the second conductivity type is P-type, the silicon nitride layer 124 is adjusted to have compressive strain. According to another preferred embodiment of the present invention, the strained layer 118 may include merely the silicon nitride layer 124 and the silicon oxide layer 122 is optional. In addition, the silicon oxide layer 122 and the silicon nitride layer 124 may be formed in the same chamber.

As shown in FIG. 16, an annealing procedure is performed to rearrange the silicon atoms according to the tensile/compressive strain provided by the strained layer 118 to form a strained silicon layer 130 in the substrate 110 under the transistor region 112 and to simultaneously drive and to activate the dopants in the doped well 136. At this point, the formation of the strained silicon layer 130 formed in the substrate 110 is completed. Then, the strained layer 118 is removed. If the first conductivity type is N-type, the strained silicon layer 130 is of tensile strain. If the second conductivity type is P-type, the strained silicon layer 130 is of compressive strain. Then, a gate 142 and a source/drain doped region 146 are formed on the doped well 136. At this point, the CMOS transistors 150 with strained silicon layer are completed.

Figure 17A:
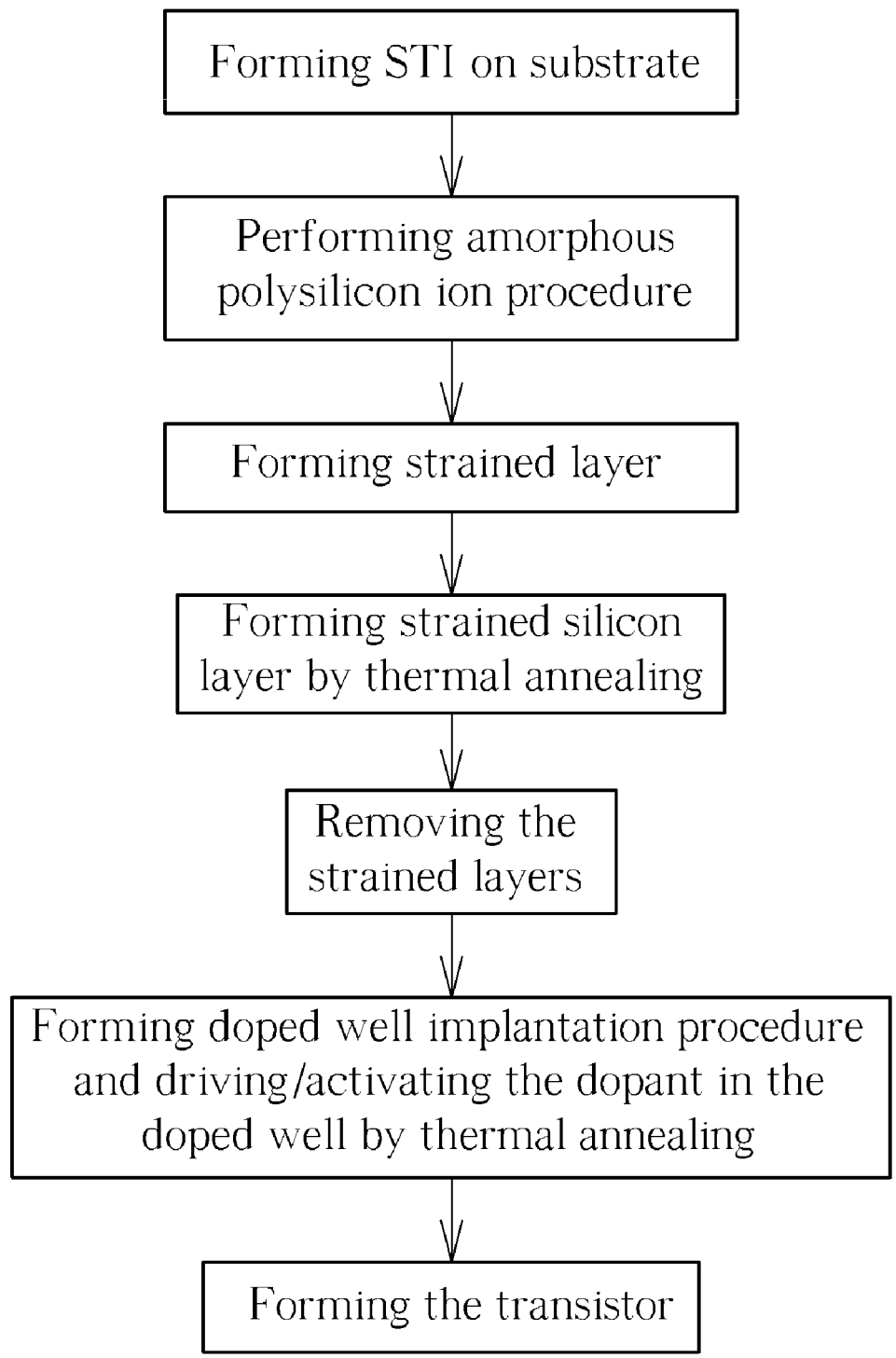
FIG. 17a illustrates procedures of the fourth preferred embodiment of the present invention.
Figure 17B:
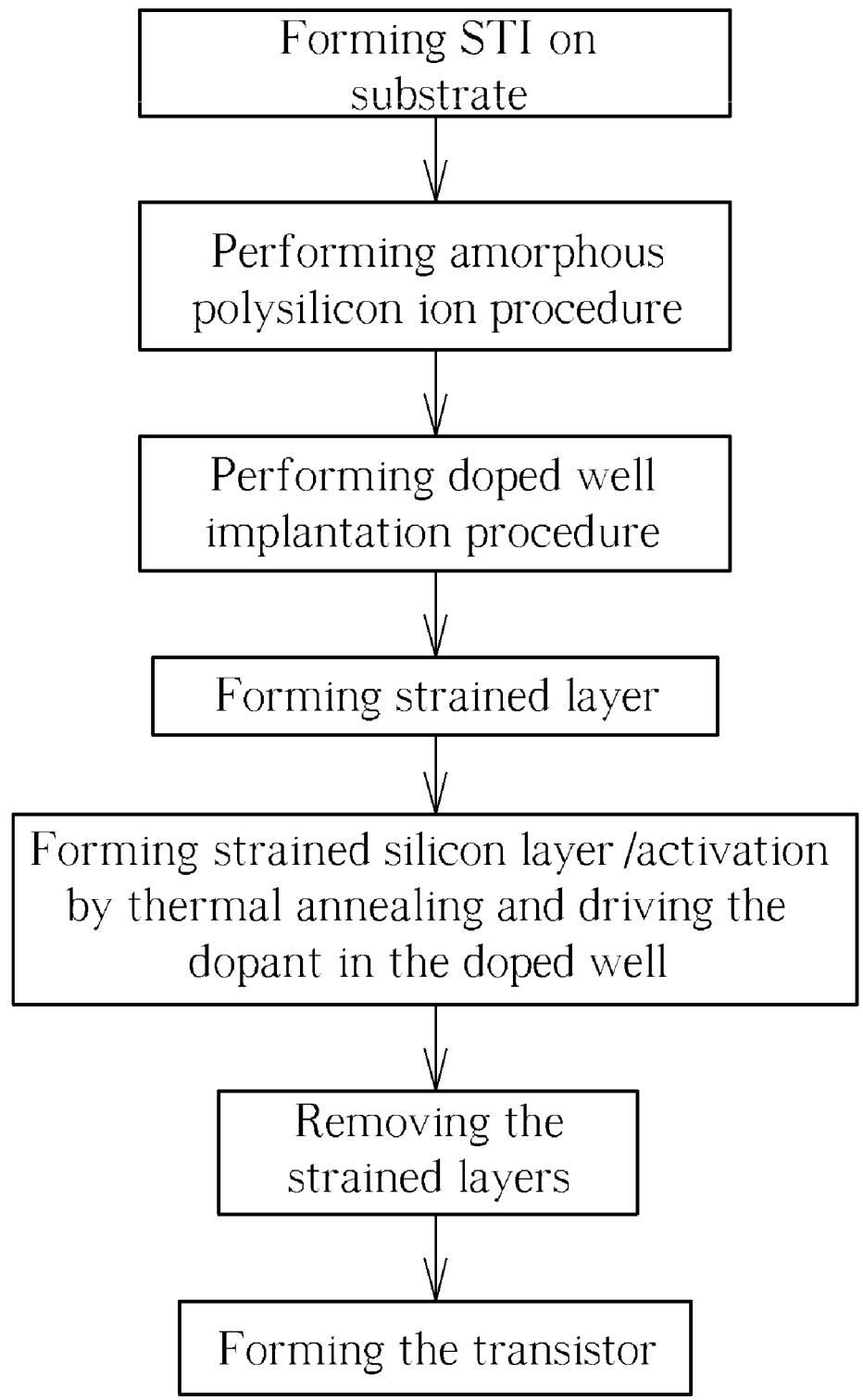
FIG. 17b illustrates procedures of the fifth preferred embodiment of the present invention and FIG. 17c illustrates procedures of the sixth preferred embodiment of the present invention.
Figure 17C:
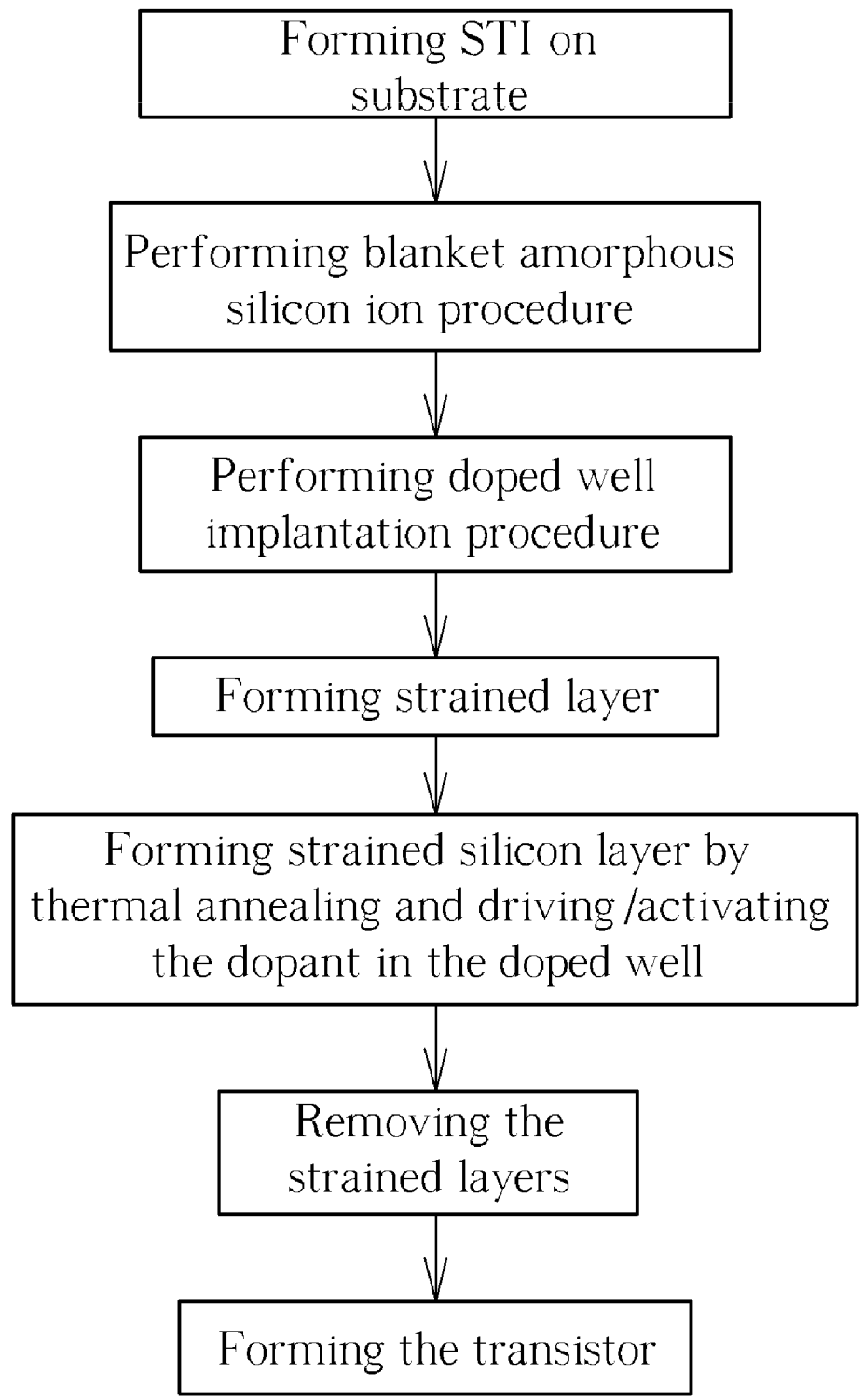

FIG. 17a illustrates the procedures of the fourth preferred embodiment of the present invention. FIG. 17b illustrates the procedures of the fifth preferred embodiment of the present invention. FIG. 17c illustrates the procedures of the sixth preferred embodiment of the present invention.

In view of the above descriptions and what are illustrated in FIGS. 17a, 17b and 17c, the features of the fourth embodiment, the fifth embodiment and the sixth embodiment of the present invention lie in the practice of the amorphous silicon procedure(s) being subsequent to the formation of the shallow trench isolation (STI) but prior to the manufacture of the transistors. In such a way, the strained silicon layer(s) can be entirely formed on the substrate of the transistor regions.

Additionally, the advantages of the fifth embodiment of the present invention resides in that the same patterned photoresist is used for both the amorphous silicon procedure and the high-concentration ion implantation procedure. Moreover, the same annealing procedure is used for driving and for activating the dopants in the doped well and for the strained layer, and may be performed in the same chamber without switching between different vacuum chambers. Furthermore, as shown in FIG. 17b, if the operational order of the amorphous silicon procedure and the doped well ion implantation procedure is exchanged, it can result in still another method for the strained silicon transistor of the present invention.

Those skilled in the art will readily observe that numerous modifications and alterations of the device and method may be made while retaining the teachings of the invention.

What is claimed is:

1. A method of fabricating a strained silicon transistor, comprising:
    providing a substrate comprising a first transistor region, a second transistor region and an insulator disposed between said first transistor region and said second transistor region;
    forming a first strained silicon layer in said substrate within said first transistor region, wherein forming said first strained silicon layer comprises:
        performing an amorphous silicon procedure within said first transistor region;
        forming a first strained layer to cover said first transistor region;
        performing a first annealing procedure to form said first strained silicon layer in said substrate within said first transistor region; and
        removing said first strained layer; and
    forming a transistor of a first conductivity type on said first strained silicon layer.

2. The method of claim 1, wherein forming said second first strained silicon layer comprises:
    performing a amorphous silicon procedure within said second transistor region;
    forming a second strained layer to cover said second transistor region;
    performing a first annealing procedure to form said second strained silicon layer in said substrate within said second transistor region; and
    removing said second strained layer.

3. The method of claim 2, wherein said first conductivity type is N-type and said second conductivity type is P-type.

4. The method of claim 2, wherein after removing said first strained layer and said second strained layer and before forming said transistor the method further comprises:
    forming a first doped well within said first transistor region;
    forming a second doped well within said second transistor region; and
    performing a second annealing procedure to activate dopants in said first doped well and in second doped well.

5. The method of claim 2, wherein said first strained layer and said second strained layer respectively comprise silicon nitride.

6. The method of claim 2, wherein said first strained layer and said second strained layer respectively comprise a structure of a bottom layer being silicon oxide and of a top layer being silicon nitride.

7. The method of claim 2, wherein said first strained layer has a tensile strain and said second strained layer has a compressive strain.

8. The method of claim 2, wherein said amorphous silicon procedure is an ion implantation procedure and said ion implantation procedure comprises using Xe, Ar and Ge ions.

9. The method of claim 1, further comprising:
    forming a second strained silicon layer in said substrate within said second transistor region; and
    forming a transistor of a second conductivity type on said second strained silicon layer.

10. A method of fabricating a strained silicon transistor, comprising:
    providing a substrate comprising a first transistor region, a second transistor region and an insulator disposed between said first transistor region and said second transistor region;
    forming a first strained silicon layer in said substrate within said first transistor region, wherein the step of forming said first strained silicon layer comprises:
        forming a first doped well within said first transistor region;
        performing a first amorphous silicon procedure within said first transistor region;
        forming a first strained layer to cover said first transistor region;
        performing an annealing procedure to form said first strained silicon layer and to drive and to activate dopants in said first doped well; and
        removing said first strained layer; and
    forming a transistor of a first conductivity type on said first strained silicon layer.

11. The method of claim 10, wherein said amorphous silicon procedures are performed after said doped wells are formed.

12. The method of claim 10, wherein said doped wells are formed after said amorphous silicon procedures are performed.

13. The method of claim 10, wherein the step of forming said second strained silicon layer comprises:
    forming a second doped well within said second transistor region;
    performing a second amorphous silicon procedure within said second transistor region;
    forming a second strained layer to cover said second transistor region; and
    performing said annealing procedure to form said second strained silicon layer and to drive and to activate dopants in said second doped well; and
    removing said second strained layer.

14. The method of claim 13, wherein said first strained layer and said second strained layer respectively comprise silicon nitride.

15. The method of claim 13, wherein said first strained layer and said second strained layer respectively comprise a structure of a bottom layer being silicon oxide and of a top layer being silicon nitride.

16. The method of claim 13, wherein said first strained layer has a tensile strain and said second strained layer has a compressive strain.

17. The method of claim 13, wherein said first amorphous silicon procedure and said second amorphous silicon procedure respectively comprise an ion implantation procedure using Xe, Ar and Ge ions.

* * * * *